(12) United States Patent
Harayama et al.

(10) Patent No.: US 8,988,656 B2
(45) Date of Patent: Mar. 24, 2015

(54) EXPOSURE APPARATUS, CALIBRATION METHOD, AND METHOD OF MANUFACTURING ARTICLE

(71) Applicant: Canon Kabushiki Kaisha, Tokyo (JP)

(72) Inventors: Tomohiro Harayama, Utsunomiya (JP); Dai Nagatani, Utsunomiya (JP); Kouji Yoshida, Utsunomiya (JP); Yuichi Ozawa, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 73 days.

(21) Appl. No.: 13/940,313

(22) Filed: Jul. 12, 2013

(65) Prior Publication Data

US 2014/0016111 A1    Jan. 16, 2014

(30) Foreign Application Priority Data

Jul. 13, 2012   (JP) .................................. 2012-157968

(51) Int. Cl.
*G03B 27/58*    (2006.01)
*G03B 27/42*    (2006.01)
*G03F 7/20*     (2006.01)

(52) U.S. Cl.
CPC ........ *G03F 7/70775* (2013.01); *G03F 7/70258* (2013.01)
USPC ............................................. 355/72; 355/53

(58) Field of Classification Search
CPC .............................. G03F 7/70775; G03F 7/20
USPC ....................................................... 355/53, 72
See application file for complete search history.

(56) References Cited

U.S. PATENT DOCUMENTS

2007/0097367 A1*  5/2007  Sakamoto ..................... 356/400
2009/0033895 A1*  2/2009  Binnard et al. ................. 355/53

FOREIGN PATENT DOCUMENTS

JP             4229348 B2    2/2009

\* cited by examiner

*Primary Examiner* — Hung Henry Nguyen
(74) *Attorney, Agent, or Firm* — Rossi, Kimms & McDowell LLP

(57) ABSTRACT

The present invention provides an exposure apparatus which exposes a substrate to light, the apparatus comprising a substrate stage, a position measurement unit configured to measure a position of the substrate stage, a structure configured to support the position measurement unit, a force measurement unit configured to measure a force that acts on the structure, a correction unit configured to correct a command for controlling the position of the substrate stage, based on the measurement value obtained by the force measurement unit, and a correction coefficient, and a calculation unit configured to calculate the correction coefficient based on position deviation information between adjacent shot regions in an evaluation substrate including a plurality of shot regions exposed without correction by the correction unit, and the measurement value obtained by the force measurement unit in exposing each shot region.

9 Claims, 5 Drawing Sheets

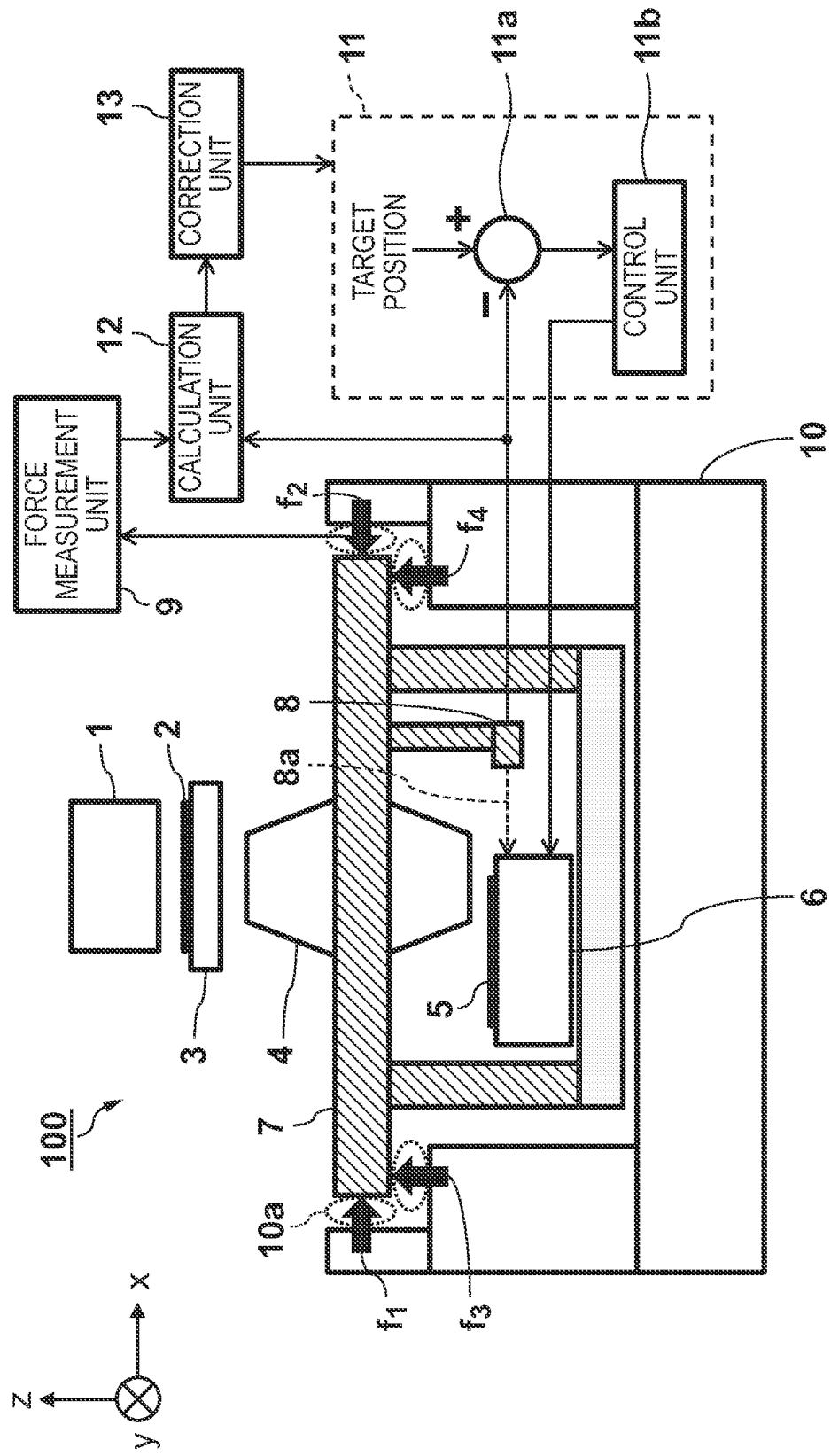

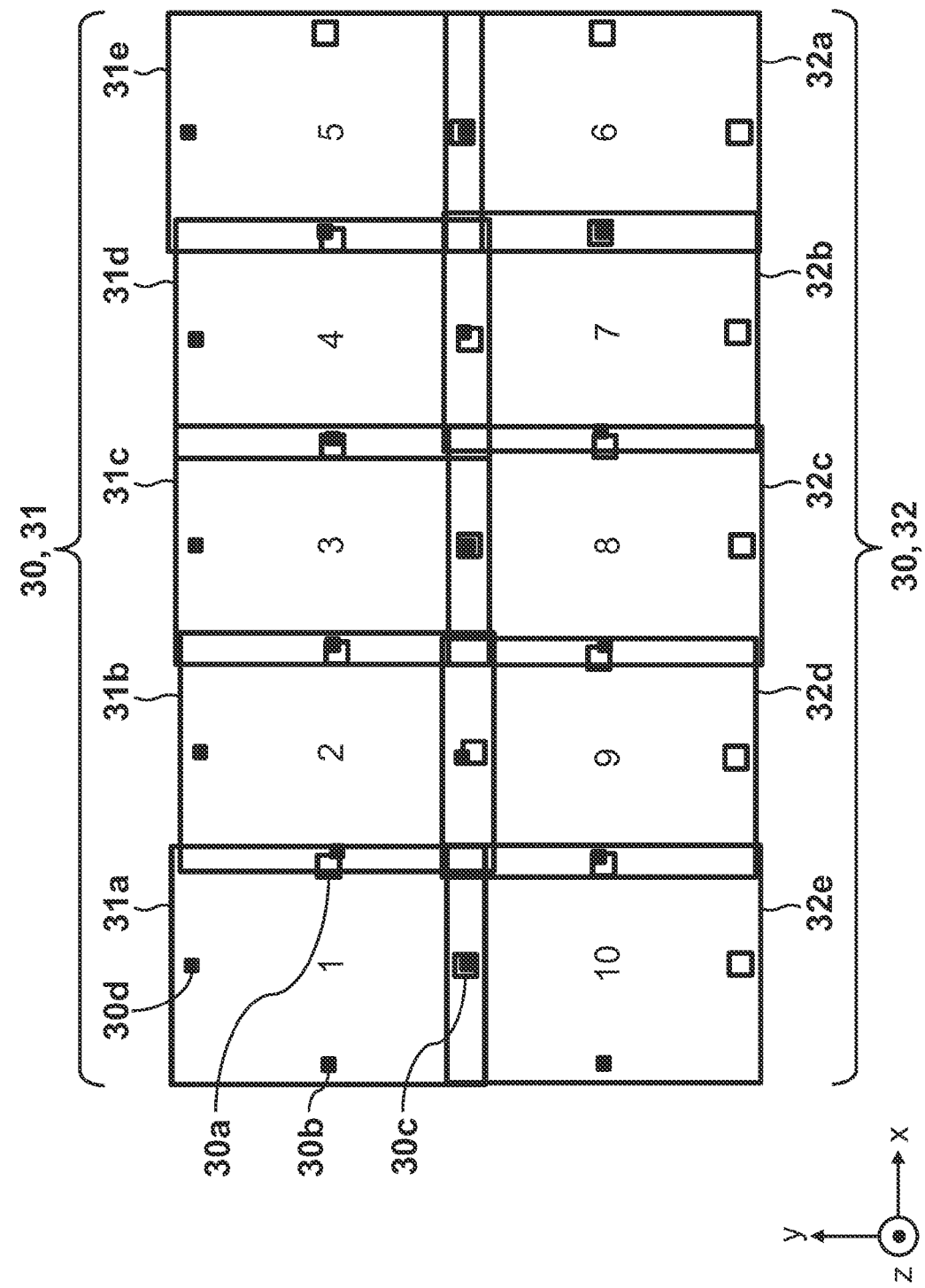

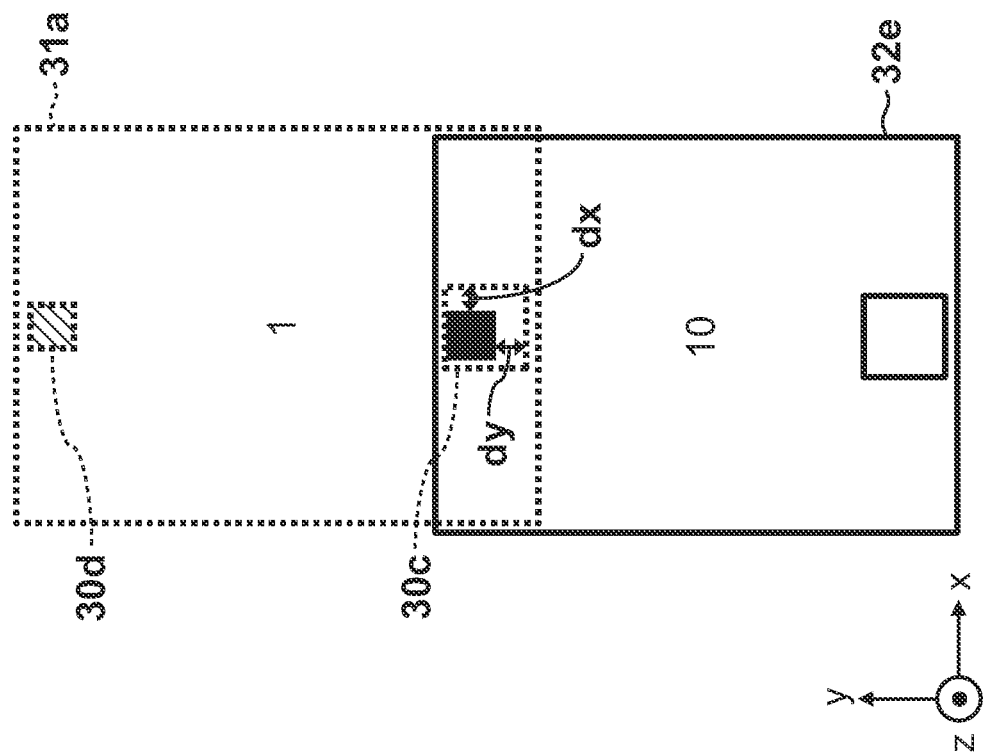
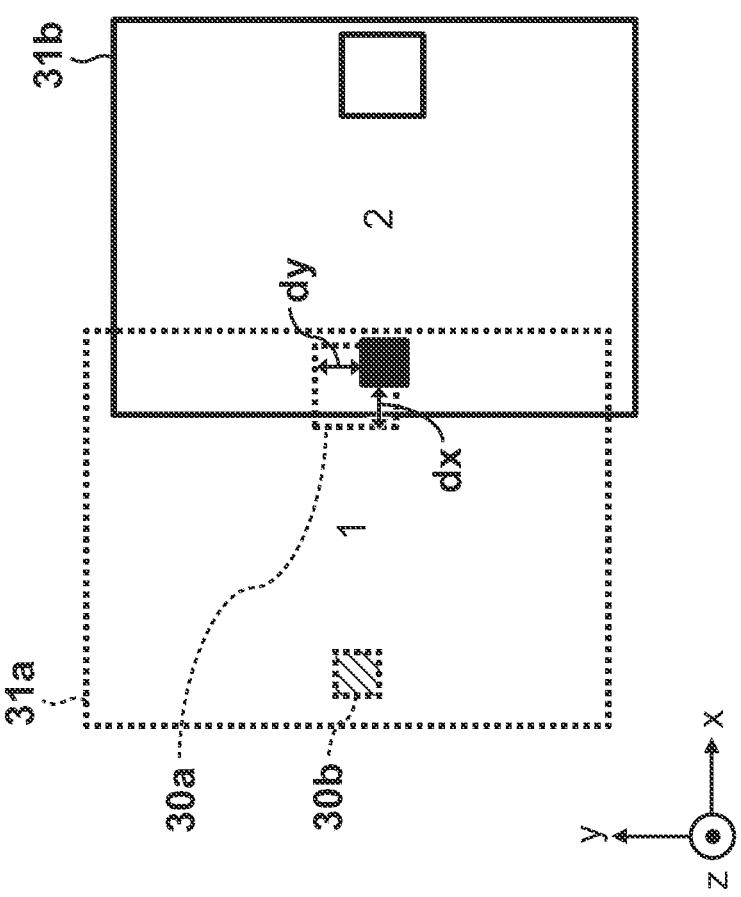

EXPOSURE APPARATUS, CALIBRATION METHOD, AND METHOD OF MANUFACTURING ARTICLE

BACKGROUND OF THE INVENTION

1. Field of the Invention

The present invention relates to an exposure apparatus, a calibration method, and a method of manufacturing an article.

2. Description of the Related Art

With miniaturization and large-scale integration of circuit patterns in semiconductor integrated circuits, it has become more important in an exposure apparatus to control the position of a substrate stage with high accuracy. Therefore, a measurement device which measures the position of the substrate stage is supported by a structure formed by a high rigidity material that hardly deforms so as to make a position deviation of the measurement device less likely to occur.

However, the structure may deform due to a force that acts on it due, for example, to vibration conducted from a support table which supports it, or a reaction force generated upon movement of the substrate stage. When this occurs, the position of the measurement device attached to the structure deviates. Such a position deviation of the measurement device leads to an error in position measurement of the substrate stage. To prevent this problem, Japanese Patent No. 4229348 proposes a method of calculating a correction coefficient using an evaluation substrate on which a plurality of patterns are formed to overlay each other, based on the position deviation information of the overlaid patterns, and the difference in force that acts on the structure in forming each pattern, and correcting a measurement error based on the correction coefficient.

An exposure apparatus described in Japanese Patent No. 4229348 calculates a correction coefficient using an evaluation substrate on which a plurality of patterns are formed to overlay each other, based on the position deviation information of the overlaid patterns, and the difference in force that acts on the structure in forming each pattern. However, when a correction coefficient is calculated using an evaluation substrate on which a plurality of patterns are formed to overlay each other, the position of the substrate stage remains almost the same in forming a first-layer pattern and in forming a second-layer pattern. Therefore, the position deviation of the overlaid patterns, and the difference in force that acts on the structure in forming each pattern are small, so the use of the correction coefficient in the exposure apparatus described in Japanese Patent No. 4229348 is insufficient to allow successful calibration of a position control system of a substrate stage.

SUMMARY OF THE INVENTION

The present invention provides a technique advantageous in terms of controlling a substrate with high accuracy in an exposure apparatus.

According to one aspect of the present invention, there is provided an exposure apparatus which exposes a substrate to light, the apparatus comprising: a substrate stage configured to be movable upon holding the substrate; a position measurement unit configured to measure a position of the substrate stage; a structure configured to support the position measurement unit; a force measurement unit configured to measure a force that acts on the structure; a correction unit configured to correct a command for controlling the position of the substrate stage, based on the measurement value obtained by the force measurement unit, and a correction coefficient; and a calculation unit configured to calculate the correction coefficient using an evaluation substrate including a plurality of shot regions exposed without correction by the correction unit, the plurality of shot regions including a first shot region, a second shot region adjacent to the first shot region, and a third shot region adjacent to the second shot region, and each shot region including a first mark and a second mark, wherein the calculation unit calculates the correction coefficient based on position deviation information between the first mark in the first shot region, and the second mark in the second shot region, position deviation information between the first mark in the second shot region, and the second mark in the third shot region, and the measurement value obtained by the force measurement unit in exposing each shot region.

Further features of the present invention will become apparent from the following description of exemplary embodiments with reference to the attached drawings.

BRIEF DESCRIPTION OF THE DRAWINGS

FIG. 1 is a view showing an exposure apparatus according to the first embodiment of the present invention;

FIG. 4 is a view showing a plurality of shot regions formed in juxtaposition with each other on an evaluation substrate; and FIGS. 5A and 5B are views showing the layout relationship between adjacent shot regions.

DESCRIPTION OF THE EMBODIMENTS

Figure 2A:
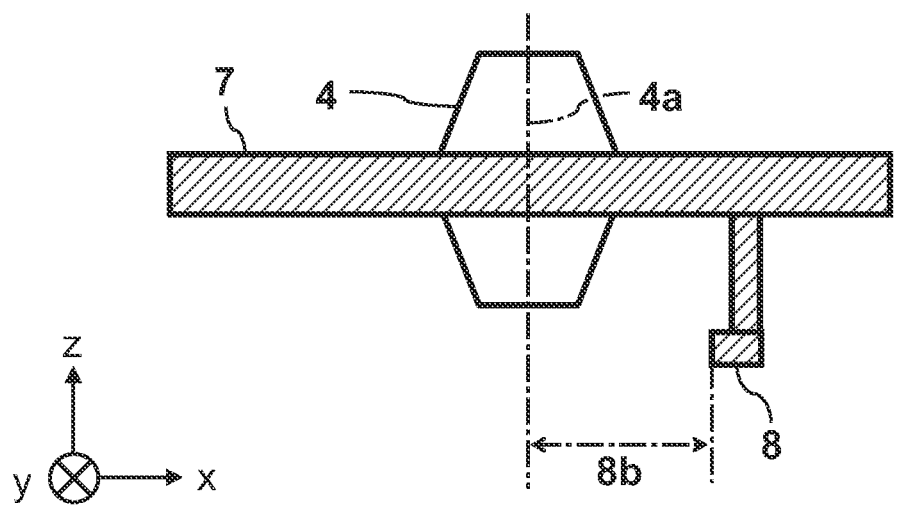
FIGS. 2A and 2B are views showing a projection optical system, a position measurement unit, and a structure which supports them.

Exemplary embodiments of the present invention will be described below with reference to the accompanying drawings. Note that the same reference numerals denote the same members throughout the drawings, and a repetitive description thereof will not be given. Also, in the specification and drawings, a direction parallel to the optical axis of a projection optical system is defined as the Z-direction, and two orthogonal directions within a plane perpendicular to the Z-direction are defined as the X- and Y-directions.

First Embodiment

An exposure apparatus 100 according to the first embodiment of the present invention will be described with reference to FIG. 1. The exposure apparatus 100 according to the first embodiment includes an illumination system 1, mask stage 3, projection optical system 4, substrate stage 6, structure 7, position measurement unit 8, and force measurement unit 9. The exposure apparatus 100 also includes a position control system 11 which controls the position of the substrate stage 6, a calculation unit 12 which calculates a correction coefficient, and a correction unit 13 which corrects a command value for controlling the position of the substrate stage 6.

The illumination system 1 illuminates a mask 2 held on the mask stage 3 with exposure light emitted by a light source. The projection optical system 4 has a predetermined magnification (for example, a unity magnification), and projects a pattern formed on the mask 2 onto a substrate 5. The substrate stage 6 is configured to be movable in directions (X- and Y-directions) perpendicular to the optical axis direction (Z-direction) of exposure light upon holding the substrate 5. The position measurement unit 8 includes, for example, a laser interferometer attached to the structure 7, and measures the position of the substrate stage 6. The laser interferometer irradiates a reflection plate (not shown) provided on the substrate stage 6 with laser light 8a to detect a displacement of the substrate stage 6 from a reference position using the laser light 8a reflected by the reflection plate. The position measurement unit 8 calculates the current position of the substrate stage 6 based on the displacement detected by the laser interferometer. The structure 7 supports the projection optical system 4, substrate stage 6, and position measurement unit 8, and is formed by a high rigidity material that hardly deforms so as to make a position deviation of the position measurement unit 8 less likely to occur. Also, the structure 7 is supported by a support table 10 through, for example, an air spring 10a. The force measurement unit 9 measures a force applied from the support table 10 to the structure 7. The force that acts on the structure 7 (the measurement value obtained by the force measurement unit 9) is calculated by, for example, measuring the pressure value of the air spring 10a between the support table 10 and the structure 7, and multiplying the measured pressure value by an effective sectional area (the area of a surface which receives a force in the structure 7).

The position control system 11 includes a subtracter 11a which subtracts the current position of the substrate stage 6 from its target position to generate a command value, and a control unit 11b which controls the substrate stage 6. The subtracter 11a calculates a control error between the target position of the substrate stage 6 and the current position of the substrate stage 6 measured by the position measurement unit 8 to generate a command value for controlling the substrate stage 6 so as to reduce the calculated control error. The control unit 11b controls the substrate stage 6 based on the command value generated by the subtracter 11a.

Figure 2B:
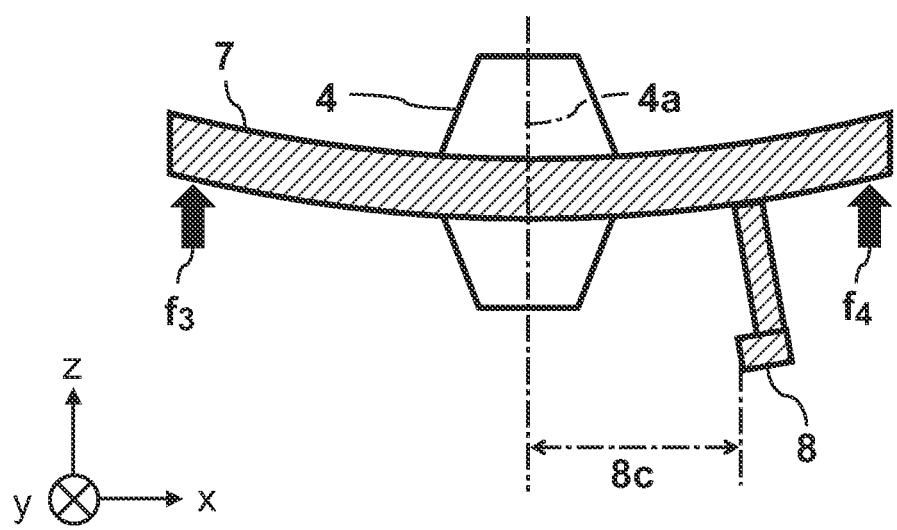

The projection optical system 4, substrate stage 6, and position measurement unit 8 are supported by the structure 7 formed by a high rigidity material that hardly deforms so as to make a position deviation of the position measurement unit 8 less likely to occur. However, the structure 7 deforms albeit slightly as a force acts on it due, for example, to vibration conducted from the support table 10 that supports it, or a reaction force generated upon movement of the substrate stage 6, so the position of the position measurement unit 8 attached to it deviates. A position deviation of the position measurement unit 8 will be described herein with reference to FIGS. 2A and 2B. FIGS. 2A and 2B are views showing the projection optical system 4, the position measurement unit 8, and the structure 7 which supports them in the exposure apparatus 100. In the state where no force acts on the structure 7, the position measurement unit 8 is spaced apart from an optical axis 4a of the projection optical system 4 by a distance 8b, as shown in FIG. 2A. On the other hand, in the state where forces $f_3$ and $f_4$ act on the structure 7, the structure 7 deforms due to these forces, so the position measurement unit 8 is spaced apart from the optical axis 4a of the projection optical system 4 by a distance 8c, as shown in FIG. 2B. That is, when the structure 7 deforms as a force acts on it, the position of the position measurement unit 8 deviates, and this may generate an error in the measurement value of the position of the substrate stage 6 obtained by the position measurement unit 8. As a means for suppressing such a position deviation of the position measurement unit 8, it is possible to further improve the rigidity of the structure 7. However, an improvement in rigidity of the structure 7 entails, for example, an increase in cost of an exposure apparatus, and constraints on the transport and installation position of the exposure apparatus. Hence, the exposure apparatus 100 according to the first embodiment includes the calculation unit 12 which calculates a correction coefficient, and the correction unit 13 which corrects a command value for controlling the substrate stage 6, and calibrates the position of the substrate stage 6.

Figure 3:
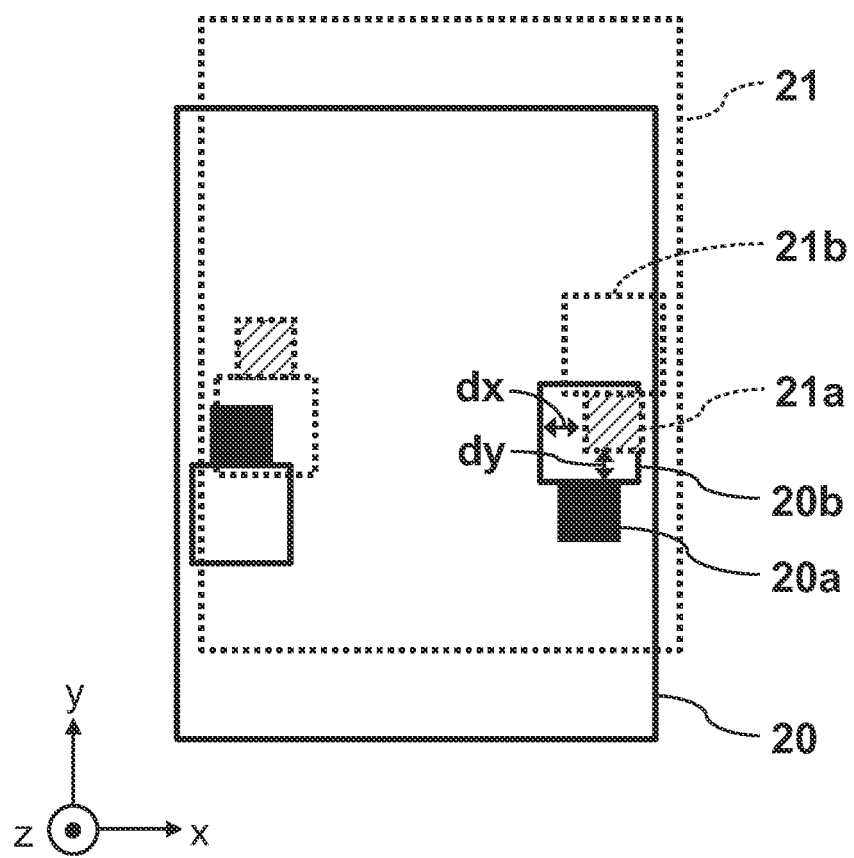
FIG. 3 is a view showing a plurality of shot regions formed to overlay each other on an evaluation substrate.

The calculation unit 12 calculates a correction coefficient using an evaluation substrate having a plurality of shot regions exposed without correction by the correction unit 13. A method of calculating a correction coefficient in the exposure apparatus 100 according to the first embodiment will be described herein by a comparison with the exposure apparatus described in Japanese Patent No. 4229348. A method of calculating a correction coefficient in the exposure apparatus described in Japanese Patent No. 4229348 will be described first. The exposure apparatus described in Japanese Patent No. 4229348 calculates a correction coefficient using an evaluation substrate on which a plurality of shot regions are formed to overlay each other. More specifically, a mask on which first and second marks are formed close to each other is used so that a shot region (to be referred to as a first pattern 20 hereinafter) in first-layer exposure, and that (to be referred to as a second pattern 21 hereinafter) in second-layer exposure are formed on an evaluation substrate to overlay each other. FIG. 3 is a view showing the first pattern 20 and second pattern 21 formed on the evaluation substrate to overlay each other. Referring to FIG. 3, a solid line indicates the first pattern 20, in which a first mark 20a and a second mark 20b are formed close to each other. Similarly, a broken line indicates the second pattern 21, in which a first mark 21a and a second mark 21b are formed close to each other. In forming the second pattern 21 on the first pattern 20, the substrate stage 6 is controlled so that the first mark 21a and second mark 21b of the second pattern 21 overlap the second mark 20b and first mark 20a, respectively, of the second pattern 21, as shown in FIG. 3. At this time, as described above, the structure 7 deforms as a force acts on it, and this generates an error in position measurement of the substrate stage 6 in the position measurement unit 8. As a result, a relative position deviation (a position deviation in the X-direction is defined as dx, and that in the Y-direction is defined as dy) occurs between the mark of the first pattern 20 and that of the second pattern 21. A correction coefficient is calculated based on the obtained relative position deviation information (dx and dy), and the difference between the measurement values obtained by the force measurement unit 9 in forming the first pattern 20 and second pattern 21. When a correction coefficient is calculated in the exposure apparatus described in Japanese Patent No. 4229348, the position of the substrate stage 6 remains almost the same in forming the first pattern 20 and in forming the second pattern 21. Therefore, the position deviation between the first pattern 20 and the second pattern 21, and the difference in force that acts on the structure in forming each pattern may be too small to allow successful calibration of the position control system 11 of the substrate stage 6. To prevent this problem, the exposure apparatus 100 according to the first embodiment calculates a correction coefficient using an evaluation substrate on which a plurality of shot regions are formed in juxtaposition with each other.

A method of calculating a correction coefficient in the exposure apparatus 100 according to the first embodiment will be described next. In the exposure apparatus 100 according to the first embodiment, a mask on which first and second marks are formed to be apart from each other in the X-direction (first direction), and third and fourth marks are formed to be apart from each other in the Y-direction (second direction) is used to form a plurality of shot regions 30 in juxtaposition with each other on an evaluation substrate, as shown in FIG. 4. FIG. 4 is a view showing the plurality of shot regions 30 formed in juxtaposition with each other on the evaluation substrate. Referring to FIG. 4, numbers in the respective shot regions 30 indicate the order in which they are exposed. In each shot region 30, a first mark 30a and a second mark 30b are formed to be apart from each other in the X-direction (first direction), and a third mark 30c and a fourth mark 30d are formed to be apart from each other in the Y-direction (second direction). The plurality of shot regions 30 include a plurality of shot regions 31 (a first shot region 31a, second shot region 31b, third shot region 31c, . . . ) aligned in the X-direction. The plurality of shot regions 30 also include a plurality of shot regions 32 (a sixth shot region 32a, seventh shot region 32b, eighth shot region 32c, . . . ) aligned in the X-direction at positions shifted in the Y-direction from the plurality of shot regions 31.

In the plurality of shot regions 30, the first mark 30a in one of shot regions adjacent in the X-direction, and the second mark 30b in the other are arranged to overlap each other. FIG. 5A shows the layout relationship between, for example, the first shot region 31a exposed in the first operation, and the second shot region 31b exposed in the second operation. Referring to FIG. 5A, a broken line indicates the first shot region 31a exposed in the first operation, and a solid line indicates the second shot region 31b exposed in the second operation. Also, the first mark 30a and second mark 30b are formed in the first shot region 31a and second shot region 31b, respectively, to be apart from each other in the X-direction (first direction) (the third mark 30c and fourth mark 30d are not shown). In exposing the second shot region 31b, the substrate stage 6 is controlled so that the second mark 30b in the second shot region 31b overlaps the first mark 30a in the first shot region 31a, as shown in FIG. 5A. At this time, as described above, the structure 7 deforms as a force acts on it, and this generates a measurement error in the measurement value of the position of the substrate stage 6 obtained by the position measurement unit 8. As a result, a relative position deviation (a position deviation in the X-direction is defined as dx, and that in the Y-direction is defined as dy) occurs between the first mark 30a in the first shot region 31a and the second mark 30b in the second shot region 31b.

Similarly, in the plurality of shot regions 30, the third mark 30c in one of shot regions adjacent in the Y-direction, and the fourth mark 30d in the other are arranged to overlap each other. FIG. 5B shows the layout relationship between, for example, the first shot region 31a exposed in the first operation, and the 10th shot region 32e exposed in the 10th operation. Referring to FIG. 5B, a broken line indicates the first shot region 31a exposed in the first operation, and a solid line indicates the 10th shot region 32e exposed in the 10th operation. Also, the third mark 30c and fourth mark 30d are formed in the first shot region 31a and 10th shot region 32e, respectively, to be apart from each other in the Y-direction (second direction) (the first mark 30a and second mark 30b are not shown). In exposing the 10th shot region 32e, the substrate stage 6 is controlled so that the fourth mark 30d in the 10th shot region 32e overlaps the third mark 30c in the first shot region 31a, as shown in FIG. 5B. At this time, as described above, the structure 7 deforms as a force acts on it, and this generates a measurement error in the measurement value of the position of the substrate stage 6 obtained by the position measurement unit 8. As a result, a relative position deviation (a position deviation in the X-direction is defined as dx, and that in the Y-direction is defined as dy) occurs between the third mark 30c in the first shot region 31a and the fourth mark 30d in the 10th shot region 32e.

With this arrangement, in an evaluation substrate on which the plurality of shot regions 30 are formed in juxtaposition with each other, the difference in position of the substrate stage 6 in exposing each shot region 30 is larger than that in the exposure apparatus described in Japanese Patent No. 4229348. Therefore, the relative position deviation between adjacent shot regions, and the difference in force that acts on the structure 7 in forming each shot region 30 can be set large to calculate a correction coefficient which allows successful correction of a measurement error of the position of the substrate stage 6. A method of calculating a correction coefficient by the calculation unit 12 in the exposure apparatus 100 according to the first embodiment will be described herein. In an evaluation substrate on which the plurality of shot regions 30 are formed in juxtaposition with each other, as shown in FIG. 4, the relative position deviations dx and dy between marks (the first and second marks or the third and fourth marks) in adjacent shot regions are defined as $x_{m\_n}$ and $y_{m\_n}$. Note that m and n are numbers indicating the order in which the respective shot regions 30 are exposed. For example, the relative position deviation between the first shot region 31a exposed in the first operation, and the second shot region 31b exposed in the second operation can be defined as $x_{1\_2}$ for dy, and $y_{1\_2}$ for dy. Also, the relative position deviation between the first shot region 31a exposed in the first operation, and the 10th shot region 32e exposed in the 10th operation can be defined as $x_{1\_10}$ for dy, and $y_{1\_10}$ for dy. When relative position deviations are defined in this manner, the relative position deviation (the position deviation in the X-direction is defined as X, and that in the Y-direction is defined as Y) in the plurality of shot regions 30 is expressed as:

$$X = [x_{1\_2} \, x_{2\_3} \, x_{3\_4} \, x_{4\_5} \, x_{1\_10} \, x_{2\_9} \, x_{3\_8} \, x_{4\_7} \, x_{5\_6}]^T$$

$$Y = [y_{1\_2} \, y_{2\_3} \, y_{3\_4} \, y_{4\_5} \, y_{1\_10} \, y_{2\_9} \, y_{3\_8} \, y_{4\_7} \, y_{5\_6}]^T$$

Assume that four forces $f_1$ to $f_4$ act on the structure 7 in exposing each shot region 30, as shown in, for example, FIG. 1. As described above, the forces $f_1$ to $f_4$ that act on the structure 7 are measured by the force measurement unit 9 and, more specifically, the forces $f_1$ to $f_4$ are calculated by measuring the pressure value of the air spring 10a between the support table 10 and the structure 7, and multiplying the measured pressure value by an effective sectional area (the area of a surface which receives a force in the structure 7). The forces $f_1$ to $f_4$ that act on the structure 7 are measured by the force measurement unit 9 in exposing each shot region 30, and are defined as $f_{m\_1}$ to $f_{m\_4}$. Note that m is a number indicating the order in which the respective shot regions 30 are exposed. For example, in the first shot region 31a exposed in the first operation, forces that act on the structure 7 in exposing the first shot region 31a can be defined as $f_{1\_1}$ to $f_{1\_4}$. When forces that act on the structure 7 are defined in this manner, a force F that acts on the structure 7 in exposing the plurality of shot regions 30 is expressed as:

$$F = \begin{bmatrix} f_{1\_1} & f_{1\_2} & f_{1\_3} & f_{1\_4} \\ f_{2\_1} & f_{2\_2} & f_{2\_3} & f_{2\_4} \\ f_{3\_1} & f_{3\_2} & f_{3\_3} & f_{3\_4} \\ f_{4\_1} & f_{4\_2} & f_{4\_3} & f_{4\_4} \\ f_{5\_1} & f_{5\_2} & f_{5\_3} & f_{5\_4} \\ f_{6\_1} & f_{6\_2} & f_{6\_3} & f_{6\_4} \\ f_{7\_1} & f_{7\_2} & f_{7\_3} & f_{7\_4} \\ f_{8\_1} & f_{8\_2} & f_{8\_3} & f_{8\_4} \\ f_{9\_1} & f_{9\_2} & f_{9\_3} & f_{9\_4} \\ f_{10\_1} & f_{10\_2} & f_{10\_3} & f_{10\_4} \end{bmatrix} \quad (2)$$

Also, a difference P that acts on the structure 7 in exposing adjacent shot regions is expressed as:

$$P = \begin{bmatrix} -f_{1\_1}+f_{2\_1} & -f_{1\_2}+f_{2\_2} & -f_{1\_3}+f_{2\_3} & -f_{1\_4}+f_{2\_4} \\ -f_{2\_1}+f_{3\_1} & -f_{2\_2}+f_{3\_2} & -f_{2\_3}+f_{3\_3} & -f_{2\_4}+f_{3\_4} \\ -f_{3\_1}+f_{4\_1} & -f_{3\_2}+f_{4\_2} & -f_{3\_3}+f_{4\_3} & -f_{3\_4}+f_{4\_4} \\ -f_{4\_1}+f_{5\_1} & -f_{4\_2}+f_{5\_2} & -f_{4\_3}+f_{5\_3} & -f_{4\_4}+f_{5\_4} \\ f_{1\_1}-f_{10\_1} & f_{1\_2}-f_{10\_2} & f_{1\_3}-f_{10\_3} & f_{1\_4}-f_{10\_4} \\ f_{2\_1}-f_{9\_1} & f_{2\_2}-f_{9\_2} & f_{2\_3}-f_{9\_3} & f_{2\_4}-f_{9\_4} \\ f_{3\_1}-f_{8\_1} & f_{3\_2}-f_{8\_2} & f_{3\_3}-f_{8\_3} & f_{3\_4}-f_{8\_4} \\ f_{4\_1}-f_{7\_1} & f_{4\_2}-f_{7\_2} & f_{4\_3}-f_{7\_3} & f_{4\_4}-f_{7\_4} \\ f_{5\_1}-f_{6\_1} & f_{5\_2}-f_{6\_2} & f_{5\_3}-f_{6\_3} & f_{5\_4}-f_{6\_4} \end{bmatrix} \quad (3)$$

Note that to suppress vibration of the structure 7, it is often the case that a linear motor, for example, is additionally interposed between the support table 10 and the structure 7. In this case, the thrust value of the linear motor can be added as a force that acts on the structure 7. Also, although four forces are considered to act on the structure 7 in the first embodiment, a larger number of forces may be considered.

The relative position deviations $x_{m\_n}$ and $y_{m\_n}$ between marks in adjacent shot regions are obtained by multiplying the difference P in force that acts on the structure 7 in exposing each shot region by proportionality constants, and adding the products. Hence, when the proportionality constants are given by:

$$A_x = [a_{x1}\, a_{x2}\, a_{x3}\, a_{x4}]^T$$

$$A_y = [a_{y1}\, a_{y2}\, a_{y3}\, a_{y4}]^T \quad (4)$$

$x_{m\_n}$ and $y_{m\_n}$ are given by:

$$x_{m\_n} = a_{x1}(-f_{m\_1}+f_{n\_1}) + a_{x2}(-f_{m\_2}+f_{n\_2}) + a_{x3}(-f_{m\_3}+f_{n\_3}) + a_{x4}(-f_{m\_4}+f_{n\_4})$$

$$y_{m\_n} = a_{y1}(-f_{m\_1}+f_{n\_1}) + a_{y2}(-f_{m\_2}+f_{n\_2}) + a_{y3}(-f_{m\_3}+f_{n\_3}) + a_{y4}(-f_{m\_4}+f_{n\_4}) \quad (5)$$

and the relative position deviations X and Y in the plurality of shot regions 30 are given by:

$$X = \begin{bmatrix} x_{1\_2} \\ x_{2\_3} \\ x_{3\_4} \\ x_{4\_5} \\ x_{1\_10} \\ x_{2\_9} \\ x_{3\_8} \\ x_{4\_7} \\ x_{5\_6} \end{bmatrix} = \begin{bmatrix} -f_{1\_1}+f_{2\_1} & -f_{1\_2}+f_{2\_2} & -f_{1\_3}+f_{2\_3} & -f_{1\_4}+f_{2\_4} \\ -f_{2\_1}+f_{3\_1} & -f_{2\_2}+f_{3\_2} & -f_{2\_3}+f_{3\_3} & -f_{2\_4}+f_{3\_4} \\ -f_{3\_1}+f_{4\_1} & -f_{3\_2}+f_{4\_2} & -f_{3\_3}+f_{4\_3} & -f_{3\_4}+f_{4\_4} \\ -f_{4\_1}+f_{5\_1} & -f_{4\_2}+f_{5\_2} & -f_{4\_3}+f_{5\_3} & -f_{4\_4}+f_{5\_4} \\ f_{1\_1}-f_{10\_1} & f_{1\_2}-f_{10\_2} & f_{1\_3}-f_{10\_3} & f_{1\_4}-f_{10\_4} \\ f_{2\_1}-f_{9\_1} & f_{2\_2}-f_{9\_2} & f_{2\_3}-f_{9\_3} & f_{2\_4}-f_{9\_4} \\ f_{3\_1}-f_{8\_1} & f_{3\_2}-f_{8\_2} & f_{3\_3}-f_{8\_3} & f_{3\_4}-f_{8\_4} \\ f_{4\_1}-f_{7\_1} & f_{4\_2}-f_{7\_2} & f_{4\_3}-f_{7\_3} & f_{4\_4}-f_{7\_4} \\ f_{5\_1}-f_{6\_1} & f_{5\_2}-f_{6\_2} & f_{5\_3}-f_{6\_3} & f_{5\_4}-f_{6\_4} \end{bmatrix} \begin{bmatrix} a_{x1} \\ a_{x2} \\ a_{x3} \\ a_{x4} \end{bmatrix} \quad (6)$$

$$Y = \begin{bmatrix} y_{1\_2} \\ y_{2\_3} \\ y_{3\_4} \\ y_{4\_5} \\ y_{1\_10} \\ y_{2\_9} \\ y_{3\_8} \\ y_{4\_7} \\ y_{5\_6} \end{bmatrix} = \begin{bmatrix} -f_{1\_1}+f_{2\_1} & -f_{1\_2}+f_{2\_2} & -f_{1\_3}+f_{2\_3} & -f_{1\_4}+f_{2\_4} \\ -f_{2\_1}+f_{3\_1} & -f_{2\_2}+f_{3\_2} & -f_{2\_3}+f_{3\_3} & -f_{2\_4}+f_{3\_4} \\ -f_{3\_1}+f_{4\_1} & -f_{3\_2}+f_{4\_2} & -f_{3\_3}+f_{4\_3} & -f_{3\_4}+f_{4\_4} \\ -f_{4\_1}+f_{5\_1} & -f_{4\_2}+f_{5\_2} & -f_{4\_3}+f_{5\_3} & -f_{4\_4}+f_{5\_4} \\ f_{1\_1}-f_{10\_1} & f_{1\_2}-f_{10\_2} & f_{1\_3}-f_{10\_3} & f_{1\_4}-f_{10\_4} \\ f_{2\_1}-f_{9\_1} & f_{2\_2}-f_{9\_2} & f_{2\_3}-f_{9\_3} & f_{2\_4}-f_{9\_4} \\ f_{3\_1}-f_{8\_1} & f_{3\_2}-f_{8\_2} & f_{3\_3}-f_{8\_3} & f_{3\_4}-f_{8\_4} \\ f_{4\_1}-f_{7\_1} & f_{4\_2}-f_{7\_2} & f_{4\_3}-f_{7\_3} & f_{4\_4}-f_{7\_4} \\ f_{5\_1}-f_{6\_1} & f_{5\_2}-f_{6\_2} & f_{5\_3}-f_{6\_3} & f_{5\_4}-f_{6\_4} \end{bmatrix} \begin{bmatrix} a_{y1} \\ a_{y2} \\ a_{y3} \\ a_{y4} \end{bmatrix} \quad (7)$$

That is, the relationship between the relative position deviations X and Y in the plurality of shot regions 30, and the difference P in force that acts on the structure 7 in exposing each shot region 30 is described by:

$$X = PA_x$$

$$Y = PA_y \quad (8)$$

When both sides of equations (8) are multiplied by the pseudo-inverse matrix of the difference P in force that acts on the structure 7, proportionality constants $A_x$ and $A_y$ are calculated. The proportionality constants $A_x$ and $A_y$ serve as correction coefficients in actually exposing a substrate.

The correction unit 13 multiplies correction coefficients (proportionality constants) calculated using an evaluation substrate by a force that acts on the structure 7 in actually exposing a substrate to obtain a correction value used to correct a command value for controlling the position of the substrate stage 6. More specifically, letting $f_1(t)$ to $f_4(t)$ be forces that act on the structure 7 (the measurement values obtained by the force measurement unit 9) for time t, a measurement error $D_x(t)$ in the X-direction and a measurement error $D_y(t)$ in the Y-direction generated by the position measurement unit 8 are given by:

$$D_x(t) = a_{x1}f_1(t) + a_{x2}f_2(t) + a_{x3}f_3(t) + a_{x4}f_4(t)$$

$$D_y(t) = a_{y1}f_1(t) + a_{y2}f_2(t) + a_{y3}f_3(t) + a_{y4}f_4(t) \quad (9)$$

The correction unit 13 supplies the measurement errors $D_x(t)$ and $D_y(t)$ to the position control system 11 as correction values to correct a command value for controlling the position of the substrate stage 6. Note that the command value is corrected by correcting, for example, the target position of the substrate stage 6, or the measurement value obtained by the position measurement unit 8.

As described above, the exposure apparatus 100 according to the first embodiment calculates a correction coefficient using an evaluation substrate on which the plurality of shot regions 30 are formed in juxtaposition with each other to correct a command value for controlling the position of the substrate stage 6, based on the calculated correction coefficient, and the measurement value obtained by the force measurement unit 9. This makes it possible to calculate a correction coefficient which allows successful correction of a measurement error generated by the position measurement unit 8, and, in turn, to calibrate the exposure apparatus 100 with high accuracy. Note that in an evaluation substrate of the exposure apparatus 100 according to the first embodiment, a position deviation between adjacent shot regions is measured using overlaid marks. This is done to measure a position deviation of the overlaid marks with high accuracy, and marks in adjacent shot regions need not always be overlaid if the position deviation of these marks can be measured with high accuracy without overlaying them. That is, respective shot regions may be arranged to be apart from each other.

<Embodiment of Method of Manufacturing Article>

A method of manufacturing an article according to an embodiment of the present invention is suitable for manufacturing various articles including a microdevice such as a semiconductor device and an element having a microstructure. The method of manufacturing an article according to this embodiment includes a step of forming a latent image pattern on a photosensitive agent, applied onto a substrate, using the above-mentioned scanning exposure apparatus (a step of exposing a substrate to light), and a step of developing the substrate having the latent image pattern formed on it in the forming step. This manufacturing method also includes subsequent known steps (for example, oxidation, film formation, vapor deposition, doping, planarization, etching, resist removal, dicing, bonding, and packaging). The method of manufacturing a device according to this embodiment is more advantageous in terms of at least one of the performance, quality, productivity, and manufacturing cost of a device than the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-157968 filed on Jul. 13, 2012, which is hereby incorporated by reference herein in its entirety.

What is claimed is:

1. An exposure apparatus which exposes a substrate to light, the apparatus comprising:
a substrate stage configured to be movable upon holding the substrate;
a position measurement unit configured to measure a position of the substrate stage;
a structure configured to support the position measurement unit;
a force measurement unit configured to measure a force that acts on the structure;
a correction unit configured to correct a command for controlling the position of the substrate stage, based on the measurement value obtained by the force measurement unit, and a correction coefficient; and
a calculation unit configured to calculate the correction coefficient using an evaluation substrate including a plurality of shot regions exposed without correction by the correction unit,
the plurality of shot regions including a first shot region, a second shot region adjacent to the first shot region, and a third shot region adjacent to the second shot region, and
each shot region including a first mark and a second mark, wherein the calculation unit calculates the correction coefficient based on position deviation information between the first mark in the first shot region, and the second mark in the second shot region, position deviation information between the first mark in the second shot region, and the second mark in the third shot region, and the measurement value obtained by the force measurement unit in exposing each shot region.

2. The apparatus according to claim 1, wherein
the first mark and the second mark included in each shot region are arranged in each shot region to be apart from each other in a first direction, and
the plurality of shot regions include a plurality of shot regions aligned in the first direction.

3. The apparatus according to claim 2, wherein shot regions adjacent in the first direction are arranged so that the first mark in one of the shot regions overlaps the second mark in the other of the shot regions.

4. The apparatus according to claim 2, wherein the plurality of shot regions aligned in the first direction include the first shot region, the second shot region, and the third shot region.

5. The apparatus according to claim 2, wherein
each shot region further includes a third mark and a fourth mark arranged to be apart from each other in a second direction different from the first direction,
the plurality of shot regions further include a plurality of shot regions arranged at positions shifted in the second direction from a plurality of shot regions aligned in the first direction, and
the plurality of shot regions arranged at the positions shifted in the second direction are aligned in the first direction.

6. The apparatus according to claim 5, wherein the calculation unit calculates the correction coefficient further using position deviation information between a third mark in one of shot regions adjacent in the second direction, and a fourth mark in the other of the shot regions.

7. The apparatus according to claim 5, wherein shot regions adjacent in the second direction are arranged so that the third mark in one of the shot regions overlaps the fourth mark in the other of the shot regions.

8. A method of manufacturing an article, the method comprising:
exposing a substrate using an exposure apparatus;
developing the exposed substrate; and
processing the developed substrate to manufacture the article,
wherein the exposure apparatus exposes the substrate to light, the apparatus including:
a substrate stage configured to be movable upon holding the substrate;
a position measurement unit configured to measure a position of the substrate stage;
a structure configured to support the position measurement unit;
a force measurement unit configured to measure a force that acts on the structure;
a correction unit configured to correct a command for controlling the position of the substrate stage, based on the measurement value obtained by the force measurement unit, and a correction coefficient; and a calculation unit configured to calculate the correction coefficient using an evaluation substrate including a plurality of shot regions exposed without correction by the correction unit, the plurality of shot regions including a first shot region, a second shot region adjacent to the first shot region, and a third shot region adjacent to the second shot region, and each shot region including a first mark and a second mark, wherein the calculation unit calculates the correction coefficient based on position deviation information between the first mark in the first shot region, and the second mark in the second shot region, position deviation information between the first mark in the second shot region, and the second mark in the third shot region, and the measurement value obtained by the force measurement unit in exposing each shot region.

9. A calibration method of calibrating an exposure apparatus which includes a substrate stage configured to be movable upon holding the substrate, a position measurement unit configured to measure a position of the substrate stage, and a structure configured to support the position measurement unit, and exposes the substrate to light, the method comprising:

calculating a correction coefficient using an evaluation substrate including a plurality of shot regions each including a first mark and a second mark arranged to be apart from each other, based on position deviation information between a first mark in a first shot region, and a second mark in a second shot region adjacent to the first shot region, position deviation information between a first mark in the second shot region, and a second mark in a third shot region adjacent to the second shot region, and a force that acts on the structure in exposing each shot region, the plurality of shot regions including the first shot region, the second shot region, and the third shot region, wherein the correction coefficient includes a coefficient used to correct a command value for controlling the position of the substrate stage.

* * * * *